US012761278B2

(12) United States Patent
Lee et al.

(10) Patent No.: US 12,761,278 B2
(45) Date of Patent: Oct. 13, 2026

(54) THERMO-HYGROSTAT

(71) Applicant: SK ON CO., LTD., Seoul (KR)

(72) Inventors: Jeong Hwan Lee, Daejeon (KR); Ji Seok Lee, Daejeon (KR); Yu Geun Kwon, Daejeon (KR); Hye Lim Do, Daejeon (KR); Seok Ha Park, Daejeon (KR); Hyeon Seok Cha, Daejeon (KR)

(73) Assignee: SK On Co., Ltd., Seoul (KR)

( * ) Notice: Subject to any disclaimer, the term of this patent is extended or adjusted under 35 U.S.C. 154(b) by 214 days.

(21) Appl. No.: 18/456,221

(22) Filed: Aug. 25, 2023

(65) Prior Publication Data

US 2024/0069100 A1 Feb. 29, 2024

(30) Foreign Application Priority Data

Aug. 26, 2022 (KR) ........................ 10-2022-0107888
Jul. 6, 2023 (KR) ........................ 10-2023-0087738

(51) Int. Cl.
*G01R 31/36* (2020.01)
*H01M 10/42* (2006.01)

(52) U.S. Cl.
CPC .... *G01R 31/3644* (2013.01); *H01M 10/4285* (2013.01)

(58) Field of Classification Search
CPC .. F24F 13/02; F24F 2203/02; G01R 31/3644; H01M 10/4285
See application file for complete search history.

(56) References Cited

U.S. PATENT DOCUMENTS

| | | | | |
|---|---|---|---|---|
| 4,572,283 | A * | 2/1986 | Vanderschaaf | F25D 17/06 165/61 |
| H229 | H * | 3/1987 | Phillips | G01N 17/002 374/134 |
| 5,344,364 | A * | 9/1994 | Michlovic | A62B 7/00 454/317 |
| 8,100,341 | B1 * | 1/2012 | Roderick | F24F 7/02 454/366 |
| 8,763,480 | B2 * | 7/2014 | Shimada | G01N 17/00 73/865.6 |
| 2018/0056755 | A1 * | 3/2018 | Chen | B60H 1/3407 |
| 2020/0124299 | A1 * | 4/2020 | Sugitani | F24F 11/74 |

* cited by examiner

*Primary Examiner* — Jonathan Bradford
(74) *Attorney, Agent, or Firm* — Jones Day

(57) ABSTRACT

A thermo-hygrostat device maintains uniform temperature and humidity inside a chamber. One example of such a device can include, among others, a chamber in which a sample is accommodated and internal temperature and humidity can be controlled; a lower duct provided on a first side of the chamber and sending a fluid inside the chamber to an outside of the chamber; a temperature and humidity control portion provided on the lower duct and controlling temperature and humidity of a fluid received from the lower duct.

12 Claims, 10 Drawing Sheets

(Section I–II)

THERMO-HYGROSTAT

CROSS-REFERENCE TO RELATED PATENT APPLICATION

The present application claims priority under 35 U.S.C. § 119(a) to Korean patent application number 10-2022-0107888 filed on Aug. 26, 2022 and Korean patent application number 10-2023-0087738 filed on Jul. 6, 2023 in the Korean Intellectual Property Office, the entire disclosure of which is incorporated by reference herein.

TECHNICAL FIELD

The present disclosure relates to techniques and devices for providing an enclosure or chamber with controlled temperature and humidity such as a thermo-hygrostat device.

A thermo-hygrostat device is a device that provides a chamber and maintains temperature and humidity of the chamber at predetermined or desired values. A thermo-hygrostat device may comprise, in some implementations, a cooler supplying cold air into the chamber, a hot air fan supplying warm air into the chamber, and a humidifier controlling and maintaining the indoor humidity of the chamber, such a cooler may include an evaporator, a condenser, a pump, a valve, and other components. In operation, such a cooler is controlled and operate to provide a cooling cycle to generate cold air from the evaporator. The hot air fan of the thermo-hygrostat device supplies warm air generated from a heating wire to the chamber. The humidifier heats water to generate water vapor to control humidity in the chamber of thermo-hygrostat device.

SUMMARY

According to one aspect of the present disclosure, a thermo-hygrostat device capable of smoothly flowing a fluid in all areas of an internal space may be provided.

According to one aspect of the present disclosure, a thermo-hygrostat device capable of maintaining a uniform flow speed of a fluid in a chamber may be provided.

According to one aspect of the present disclosure, a thermo-hygrostat device capable of minimizing a temperature deviation in a chamber according to a measurement position may be provided.

According to one aspect of the present disclosure, a thermo-hygrostat device capable of uniformly maintaining a predetermined value again even when a temperature of a sample is changed may be provided.

A thermo-hygrostat device of the present disclosure may re-supply a fluid in the chamber to an upper surface of the chamber.

A thermo-hygrostat device according to one embodiment of the present disclosure comprises: a chamber in which a sample is accommodated, in which internal temperature and humidity are controlled to predetermined temperature and humidity, and which comprises a hole provided on an upper surface thereof; a lower duct provided on a first side of the chamber and sending a fluid inside the chamber to an outside of the chamber; a temperature and humidity control portion provided on the lower duct and controlling temperature and humidity of a fluid received from the lower duct; a fluid transfer portion provided on the temperature and humidity control portion and sending a fluid received from the temperature and humidity control portion upward; and an upper duct comprising a first upper duct provided on the fluid transfer portion and a second upper duct provided on an upper surface of the chamber and communicating with the first upper duct, wherein the first upper duct may send a fluid received from the fluid transfer portion into the chamber and to the second upper duct, and the second upper duct may send a fluid received from the first upper duct into the chamber through the hole.

In one embodiment, the thermo-hygrostat device may further comprise a fluid suction portion provided on the first side of the chamber and sending the fluid inside the chamber to the lower duct.

In one embodiment, the fluid transfer portion may further comprise a blower and a communication hole communicating the fluid transfer portion and the first upper duct, wherein the blower may send a fluid received from the temperature and humidity control portion upward through the communication hole.

In one embodiment, the thermo-hygrostat device may further comprise a fluid discharge portion provided on the fluid transfer portion and sending a fluid received from the fluid transfer portion into the chamber through the first side of the chamber.

In one embodiment, the chamber may further comprise a protruding portion adjacent to the hole, and the protruding portion may be on an opposite side of the first side with reference to the hole.

In one embodiment, the holes may be provided in plurality, and each of the plurality of holes may have a predetermined length and width and may be spaced apart from each other in a width direction.

In one embodiment, the chamber may further comprise a plurality of protruding portions adjacent to each of the plurality of holes, and each of the protruding portions may be on an opposite side of the first side with reference to an adjacent hole.

In one embodiment, a width of the hole may decrease in a direction from the first side toward a second side facing the first side.

In one embodiment, a width of the hole may increase in a direction from the first side toward a second side facing the first side.

In one embodiment, a height of the protruding portion may increase in a direction from the first side toward a second side facing the first side.

In one embodiment, a height of the protruding portion may decrease in a direction from the first side toward a second side facing the first side.

In one embodiment, a height of the first upper duct may decrease in a direction away from the chamber.

In one embodiment, a height of the second upper duct may decrease in a direction from the first side toward a second side facing the first side.

In one embodiment, a height of the second upper duct may increase in a direction from the first side toward a second side facing the first side.

In one embodiment, a sample accommodated in the chamber may comprise a battery including, e.g., a rechargeable secondary battery such as a lithium ion secondary battery.

According to one aspect of the present disclosure, a fluid can smoothly flow in all areas of an internal space of a thermo-hygrostat.

According to one aspect of the present disclosure, a flow speed of a fluid in a chamber can be maintained uniformly.

According to one aspect of the present disclosure, a temperature deviation within a chamber according to a measurement position can be minimized.

According to one aspect of the present disclosure, even when a temperature of a sample is changed, it can be uniformly maintained at a predetermined value again.

DETAILED DESCRIPTION

Hereinafter, the present disclosure will be described in detail with reference to the accompanying drawings. However, this is only exemplary, and the present disclosure is not limited to the specific embodiments described as examples.

A thermo-hygrostat device may be used to maintain predetermined temperature and humidity within the chamber in various applications including, for example, evaluating the operating performance of a sample such as a battery or a rechargeable secondary battery for each temperature and humidity over certain temperature ranges and humidity conditions under which the battery or the rechargeable secondary battery will be operated. Performance of a thermo-hygrostat device depends on various factors, including whether temperature and humidity in the chamber are maintained uniformly. Whether temperature and humidity in a chamber are maintained uniformly depends on whether a flow speed of a fluid supplied into the chamber is uniform throughout an entire space inside a chamber.

Figure 1:
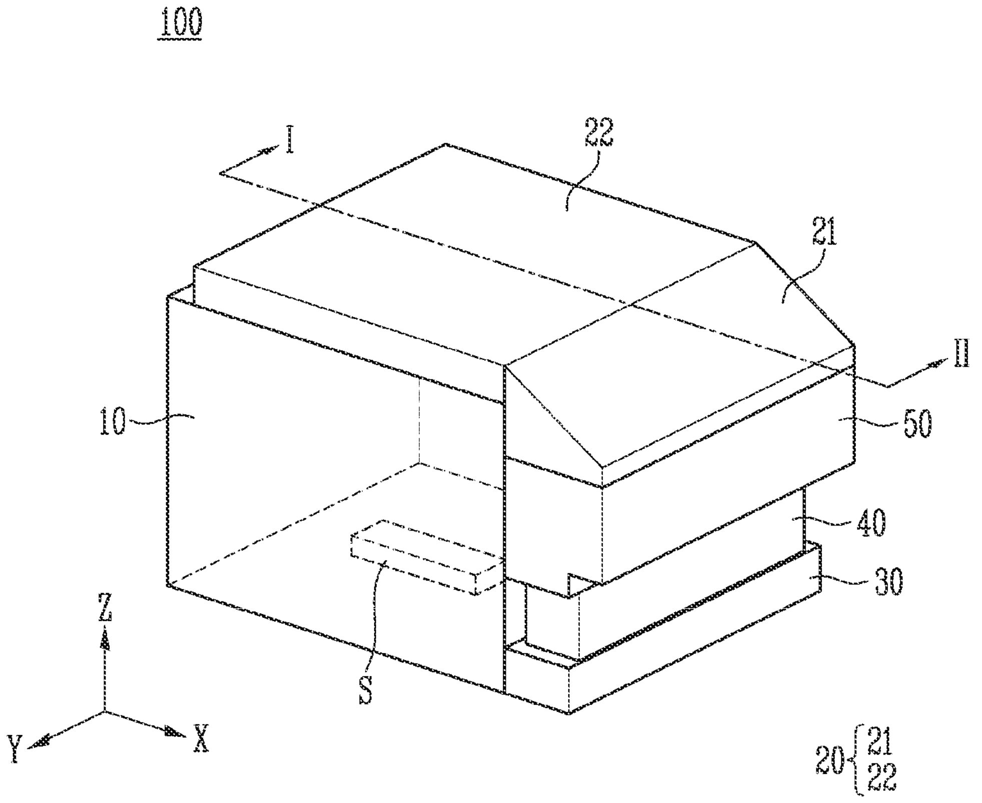
FIG. 1 is a perspective diagram of one example of an implementation of a thermo-hygrostat device of the present disclosure.
Figure 2:
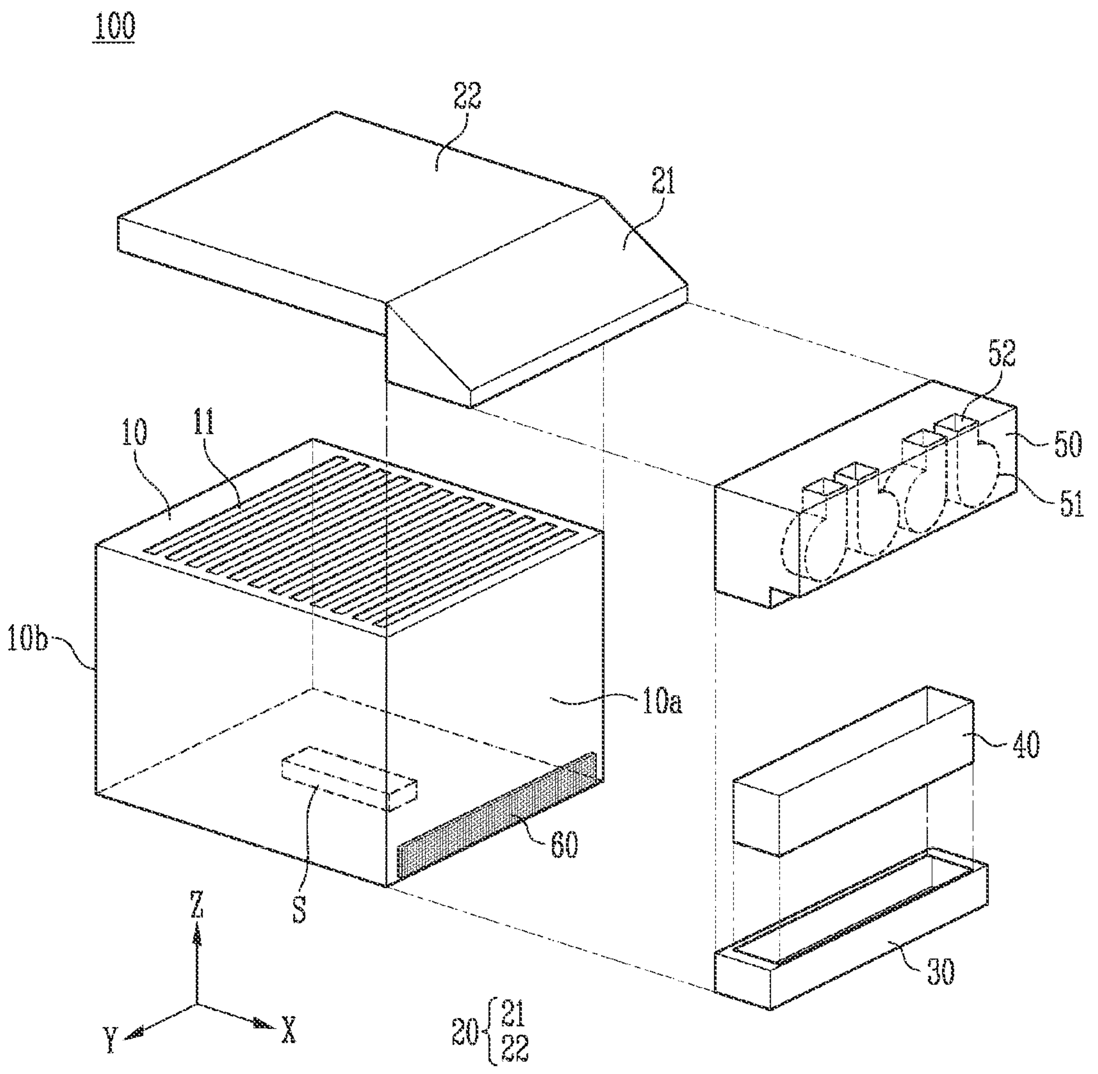
FIG. 2 is an exploded perspective diagram of the thermo-hygrostat device in FIG. 1.

FIG. 1 is a perspective diagram of an example of a thermo-hygrostat chamber or device 100 of the present disclosure. FIG. 2 is an exploded perspective diagram of the thermo-hygrostat 100 of the present disclosure. The example thermo-hygrostat device 100 of the present disclosure may comprise a chamber 10 and a chamber air circulation portion provided on a first side 10*a* and an upper surface of the chamber.

A sample S may be accommodated in the chamber 10 of the thermo-hygrostat device 100. Internal temperature and humidity of the chamber 10 may be controlled to a predetermined temperature and humidity. The chamber 10 may comprise a hole 11 provided on an upper surface. A fluid inside the chamber 10 may pass through the chamber air circulation portion. Then, a fluid inside the chamber 10 may be supplied back into the chamber 10 through an upper portion of the first side 10*a* and an upper surface of the chamber 10. A fluid inside the chamber 10, supplied through an upper surface of the chamber 10, may be supplied through a hole 11 provided on the upper surface.

A test for evaluating the performance of the sample S may be performed inside the chamber 10. Specifically, a test for evaluating performance of the sample S at a predetermined temperature and humidity may be performed inside the chamber 10. Performance of a certain sample (S) may be determined according to temperature and humidity at the time of evaluation. Therefore, when evaluating performance of a sample, it is important that the temperature and humidity inside the chamber 10 are well maintained at predetermined values.

The chamber air circulation portion discharges a fluid inside the chamber 10 from the inside of the chamber, controls temperature and humidity thereof to predetermined values, and then sends the same back to the inside of the chamber 10. The chamber air circulation portion may comprise a lower duct 30, a temperature and humidity control portion 40, a fluid transfer portion 50, and an upper duct 20.

The lower duct 30 may be provided on a first side 10*a* of the chamber 10. The lower duct may send a fluid inside the chamber 10 to an outside of the chamber 10. A fluid inside the chamber 10 sent by the lower duct 30 may be sent to the temperature and humidity control portion 40.

The temperature and humidity control portion 40 may be provided on the lower duct 30. The temperature and humidity control portion 40 may be provided on the lower duct 30 on a first side 10*a* of the chamber 10. The temperature and humidity control portion 40 may control temperature and humidity of a fluid received from the lower duct 30. The temperature and humidity control portion 40 may comprise a cooler supplying cold air, a hot air fan supplying hot air, and a humidifier maintaining indoor humidity. A cooler may consist of an evaporator, a condenser, a pump, a valve, and the like. A cooler may form a cooling cycle to generate cold air from the evaporator. A hot air fan may supply hot air generated from a heating wire to a chamber 10. The humidifier may generate water vapor by heating water to control humidity in a chamber 10.

The fluid transfer portion 50 may be provided on the temperature and humidity control portion 40. The fluid transfer portion 50 may be provided on the temperature and humidity control portion 40 on a first side 10*a* of the chamber 10. The fluid transfer portion 50 may send a fluid received from the temperature and humidity control portion 40 upward. The fluid transfer portion 50 may receive from the temperature and humidity control portion 40 a fluid of which temperature and humidity are controlled to predetermined values and send the same to an upper portion of the fluid transfer portion 50.

The upper duct 20 may send a fluid received from the fluid transfer portion 50 to the chamber 10. The upper duct 20 may comprise a first upper duct 21 and a second upper duct 22 communicating with each other. The first upper duct 21 may be provided on the fluid transfer portion 50. The first upper duct 21 may be provided on the fluid transfer portion 50 on a first side 10*a* of the chamber 10. The second upper duct 22 may be provided on an upper surface of the chamber 10. The first upper duct 21 may receive a fluid sent by the fluid transfer portion 50. The first upper duct 21 is provided on a first side 10*a* of the chamber 10, and so is capable of sending a fluid received from the fluid transfer portion into the chamber 10. The first upper duct 21 communicates with the second upper duct 22, and so is capable of sending a fluid received from the fluid transfer portion to the second upper duct 22 as well.

The second upper duct 22 may receive a fluid sent by the first upper duct 21. The second upper duct 22 may send a fluid received from the first upper duct 21 into the chamber 10. A hole 11 may be provided on an upper surface of the chamber 10. The second upper duct 22 may send a fluid received from the first upper duct 21 into the chamber 10 through the hole 11. Therefore, the thermo-hygrostat device 100 of the present disclosure may supply a fluid that has passed through the chamber air circulation portion to an upper portion of a first side 10*a* of the chamber 10.

In this particular example thermo-hygrostat device 100 of the present disclosure, a fluid inside a chamber 10 may be circulated from an upper surface of the chamber 10 downwards. Through this, an ascending air flow generated from a heat-emitting sample S (for example, a battery such as a rechargeable secondary battery) can be suppressed, and circulation of a fluid in a chamber 10 can be smoothly carried out. As a result, temperature of a sample S may be temporarily changed and then maintained constant again in a chamber 10.

In one embodiment, the thermo-hygrostat device 100 may further comprise a fluid suction portion 60 between the chamber 10 and the lower duct 30. The fluid suction portion 60 may be provided on the first side 10*a* of the chamber 10. The fluid suction portion 60 may be provided on the first side 10*a* of the chamber 10 to suck a fluid in the chamber 10. The fluid suction portion 60 may send a sucked fluid inside the chamber 10 to the lower duct 30. The lower duct 30 may send a fluid inside the chamber 10 to an outside of the chamber 10 through the fluid suction portion 60.

In one embodiment, the fluid transfer portion 50 may further comprise a blower 51 and a communication hole 52. The blower 51 may send a fluid received from the temperature and humidity control portion 40 upward. The communication hole 52 may communicate the fluid transfer portion 50 and the first upper duct 21. The blower 51 may send a fluid received from the temperature and humidity control portion 40 upward through the communication hole 52. The blower 51 may send a fluid received from the temperature and humidity control portion 40 to the first upper duct 21 through the communication hole 52. The fluid transfer portion 50 may send a fluid sent by the temperature and humidity control portion 40 to the first upper duct 21 only through the communication hole 52.

Figure 3:
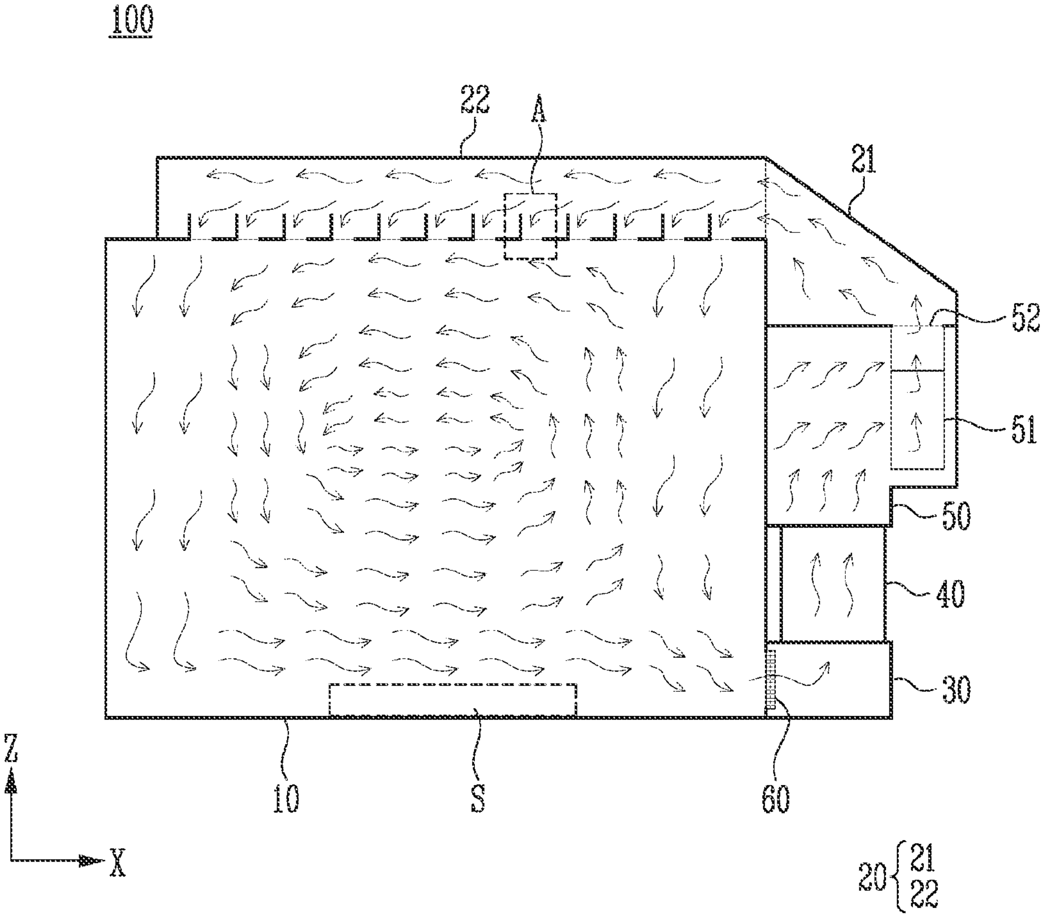
FIG. 3 is a I-II cross-sectional diagram of FIG. 1.

FIG. 3 is a I-II cross-sectional diagram of FIG. 1. A fluid flow inside the thermo-hygrostat device 100 of the present disclosure will be described in more detail with reference to FIG. 3.

The fluid suction portion 60 may send a fluid inside the chamber 10 to a lower duct 30 outside the chamber 10. The lower duct 30 may send a fluid inside the chamber 10 to the temperature and humidity control portion 40. The temperature and humidity control portion 40 may receive a fluid sent by the lower duct 30. The temperature and humidity control portion 40 may control temperature and humidity of the fluid to predetermined values. The fluid transfer portion 50 may receive a fluid sent by the temperature and humidity control portion 40. The fluid transfer portion 50 may send a fluid received from the temperature and humidity control portion to the first upper duct 21 through the communication hole 52 by the blower 51. The first upper duct 21 may receive a fluid sent by the fluid transfer portion 50. The first upper duct 21 may send a fluid sent by the fluid transfer portion 50 to the second upper duct 22 communicating with the first upper duct 21. The second upper duct 22 may send a fluid sent by the first upper duct 21 into the chamber 10 through the hole 11 provided on the chamber 10.

In one embodiment, the chamber 10 may further comprise a protruding portion 12. The protruding portion 12 may be adjacent to the hole 11. In addition, the protruding portion 12 may be positioned at a specific position adjacent to the hole 11. The protruding portion 12 may be on an opposite side of the first side 10*a* with reference to the hole 11.

Figure 4:
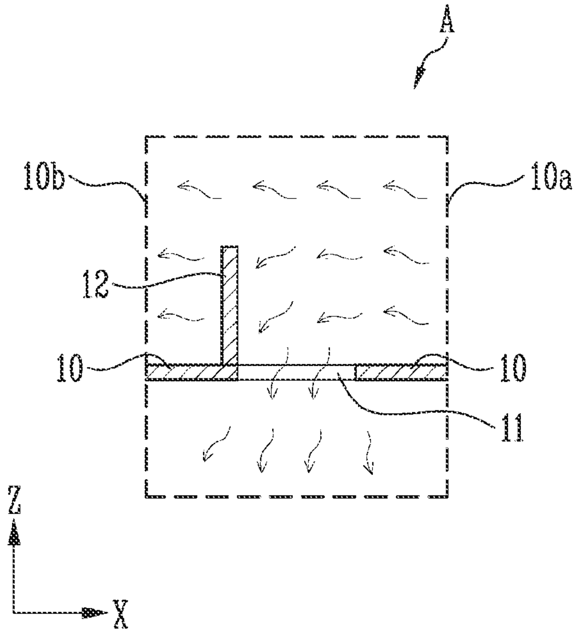
FIG. 4 is an enlarged diagram of portion A of FIG. 3.

FIG. 4 is an enlarged diagram of portion A of FIG. 3.

FIG. 4 shows how the second upper duct 22 sends a fluid received from the first upper duct 21 into the chamber 10. A fluid received by the second upper duct 22 may move in a direction from a first side 10*a* of the chamber 10 toward a second side 10*b* of the chamber 10. A part of a fluid flowing in the second upper duct 22 that collides with the protruding portion 12 may flow into the chamber 10 through the hole 11. Therefore, the protruding portion 12 adjacent to the hole 11 on an upper surface of the chamber 10 can make a fluid received by the second upper duct 22 move more smoothly into the chamber 10.

In one embodiment, the hole 11 may be provided in plurality. At this time, each of the plurality of holes 11 may have a predetermined length and width. The plurality of holes 11 may be spaced apart from each other in a width direction.

In one embodiment, when the hole 11 is provided in plurality, the protruding portion 12 may also be provided at each of the plurality of holes 11. The chamber 10 may further comprise a plurality of protruding portions 12 adjacent to each of the plurality of holes 11. Each of the protruding portion 12 may be on an opposite side of the first side 10*a* with reference to an adjacent hole 11.

When other parameters are constant, a flow speed of a fluid may usually decrease along a movement direction. In the present disclosure, a flow speed of a fluid received by the second upper duct 22 may decrease in a direction from a first side 10*a* of the chamber 10 toward a second side 10*b* facing the first side 10*a*. Design elements of the thermo-hygrostat 100 may be appropriately changed to appropriately control a flow speed of a fluid moving into the chamber 10.

Specifically, in the thermo-hygrostat device 100 of the present disclosure, a flow speed of a fluid supplied to the chamber 10 may vary depending on increase or decrease of a width of the plurality of holes 11, a height of the protruding portion 12, and a height of the second upper duct 22.

Figure 5:
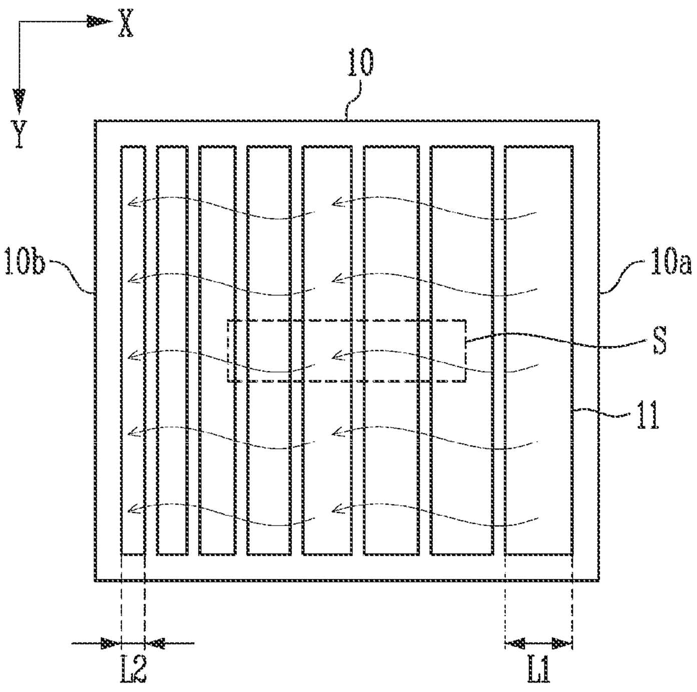
FIGS. 5 and 6 are plan diagrams of an example of one implementation of a chamber for a thermo-hygrostat device of the present disclosure.
Figure 6:
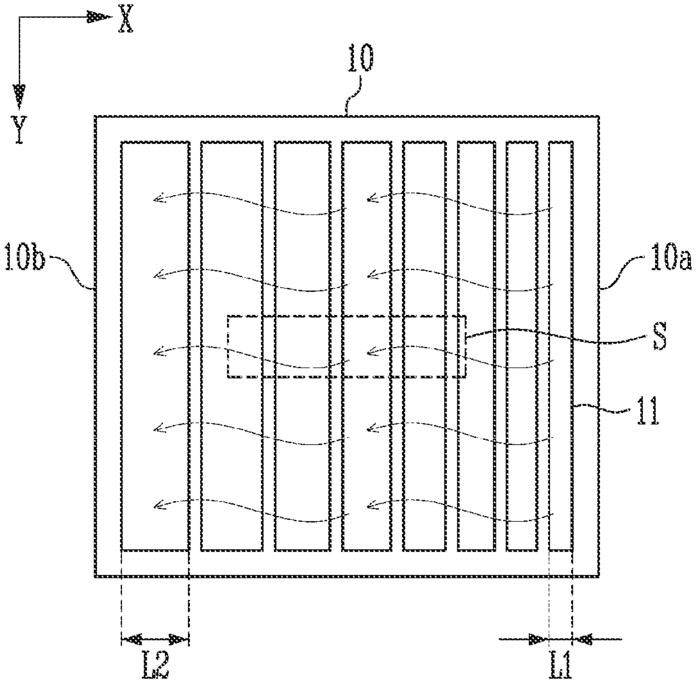

FIGS. 5 and 6 are plan diagrams of a chamber of the present disclosure.

In one embodiment, when the hole 11 is provided in plurality, a width of the hole 11 may decrease in a direction from a first side 10*a* toward a second side 10*b* facing the first side 10*a*. FIG. shows a width of the hole 11 decreasing in a direction from the first side 10*a* toward the second side 10*b*. A flow speed of a fluid sent into the chamber 10 may increase as a width of the plurality of holes 11 decreases. A width L1 of a hole 11 that is nearest to the first side 10*a* may be greater than a width L2 of a hole 11 that is nearest to the second side 10*b*. At this time, when other design elements are kept constant, a flow speed of a fluid sent into the chamber 10 may be uniformly controlled. This is because a flow speed of a fluid received by the second upper duct 22 may decrease in a movement direction.

In another embodiment, when the hole 11 is provided in plurality, a width of the hole 11 may increase in a direction from the first side 10*a* toward the second side 10*b* facing the first side 10*a*. FIG. 6 shows a width of the hole 11 increasing in a direction from the first side 10*a* toward the second side 10*b*. A flow speed of a fluid sent into the chamber 10 may decrease as a width of the plurality of holes 11 increases. A width L1 of a hole 11 that is nearest to the first side 10*a* may be smaller than a width L2 of a hole 11 that is closest to the second side 10*b*. At this time, the flow speed of the fluid sent into the chamber 10 may be uniformly maintained when other design elements are further controlled.

FIGS. 7 to 10 are enlarged diagrams of portions of FIG. 3, specifically, the portions of a lateral cross-sectional diagram of a thermo-hygrostat device of the present disclosure.

Figure 7:
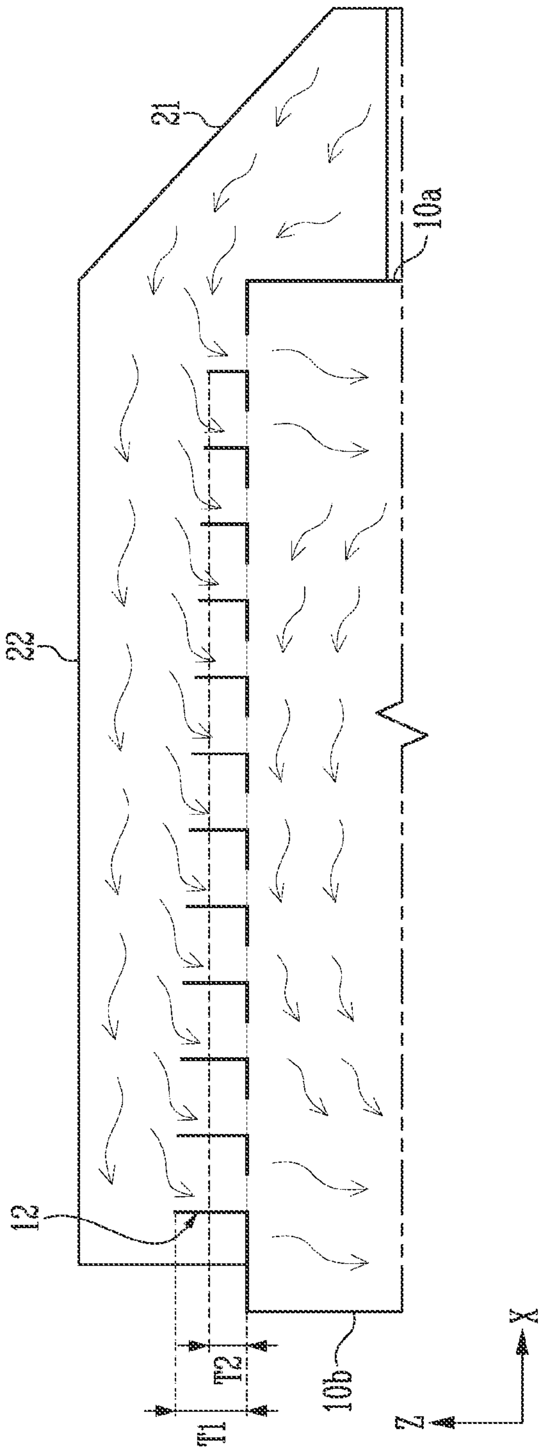
FIGS. 7, 8, 9, and 10 are enlarged diagrams of portions of FIG. 3.

In one embodiment, when the hole 11 is provided in plurality and a protruding portion 12 adjacent to the hole 11 is provided in plurality, a height of the protruding portion 12 may increase in a direction from the first side 10*a* toward the second side 10*b* facing the first side 10*a*. FIG. 7 shows a height of the protruding portion 12 increasing in a direction from the first side 10*a* toward the second side 10*b*. A flow speed of a fluid sent into the chamber 10 may increase as the height of the protruding portion 12 increases. A height T1 of a protruding portion 12 that is nearest to the first side 10*a* may be smaller than a height T2 of the protruding portion 12 that is nearest to the second side 10*b*. At this time, when other design elements are kept constant, a flow speed of a fluid sent into the chamber 10 may be uniformly controlled. This is because a flow speed of a fluid received by the second upper duct 22 may decrease in a movement direction.

Figure 8:
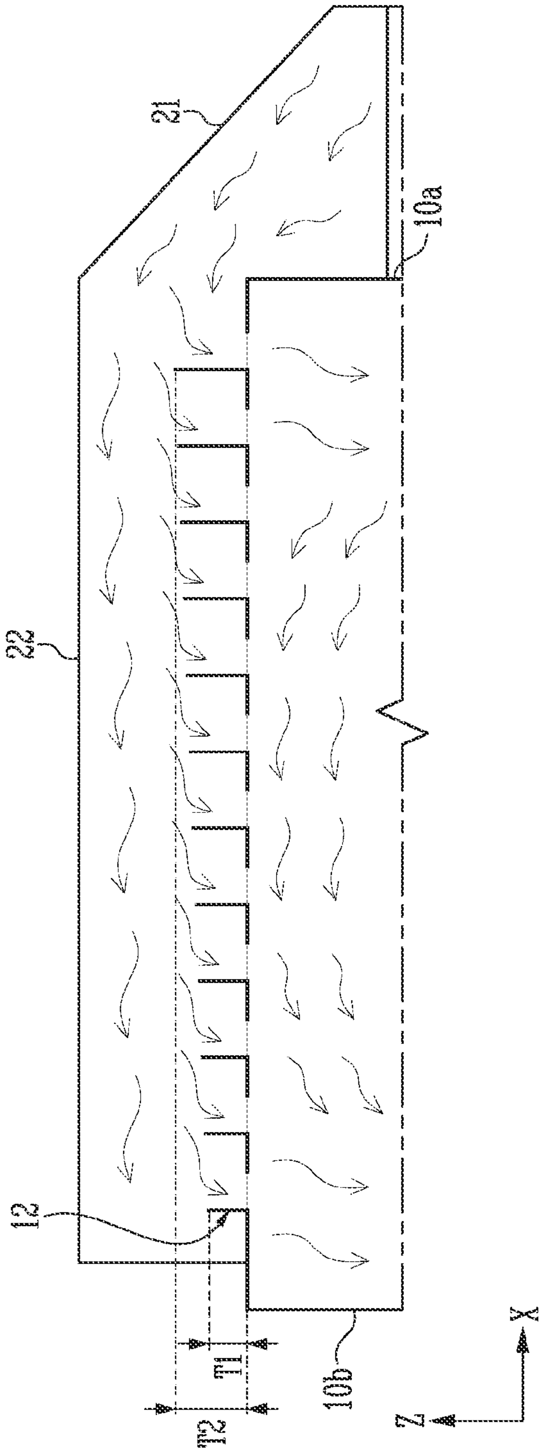

In another embodiment, when the hole 11 is provided in plurality and a protruding portion 12 adjacent to the hole 11 is provided in plurality, a height of the protruding portion 12 may decrease in a direction from the first side 10*a* toward the second side 10*b* facing the first side 10*a*. FIG. 8 shows a height of the protruding portion 12 decreasing in a direction from the first side 10*a* toward the second side 10*b*. A flow speed of a fluid sent into the chamber 10 may increase as the height of the protruding portion 12 decreases. A height T1 of a protruding portion 12 that is nearest to the first side 10*a* may be greater than a height T2 of the protruding portion 12 that is nearest to the second side 10*b*. At this time, a flow speed of a fluid sent into the chamber 10 may be uniformly maintained when other design elements are further controlled.

Figure 9:
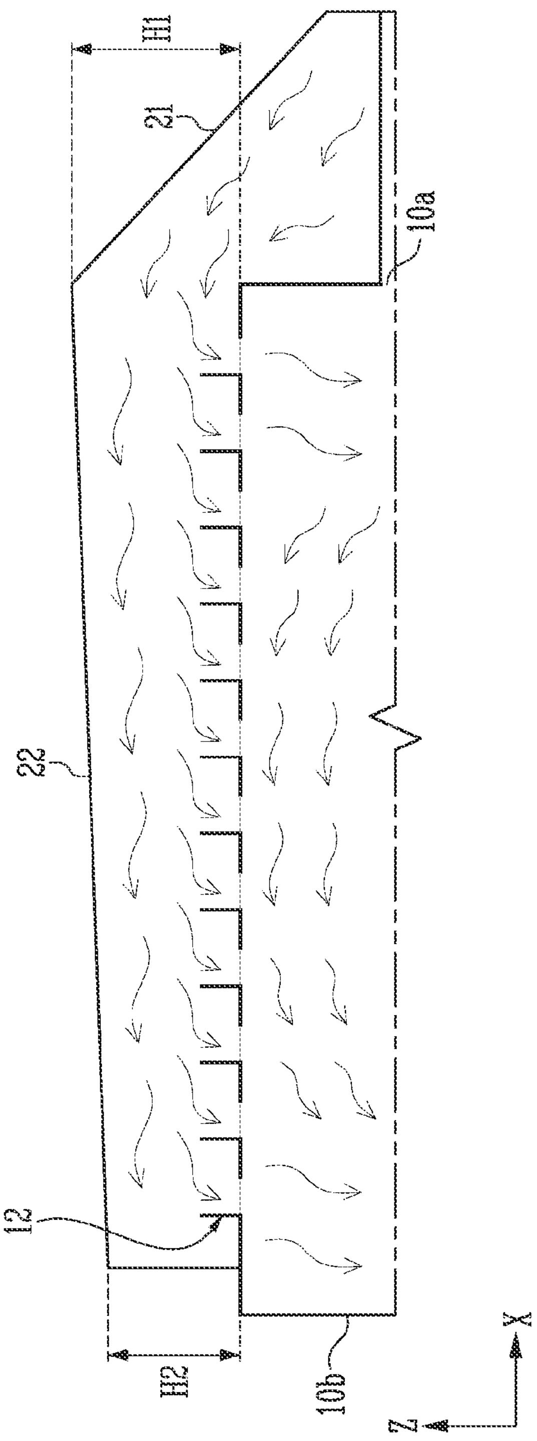

In one embodiment, a height of the second upper duct 22 may decrease in a direction from the first side 10*a* toward the second side 10*b* facing the first side 10*a*. FIG. 9 shows a height of the second upper duct 22 decreasing in a direction from the first side 10*a* to the second side 10*b*. A flow speed of a fluid sent into the chamber 10 may increase as a height of the second upper duct 22 decreases. A height H1 of the second upper duct 22 that is nearest to the first side 10*a* may be greater than a height H2 of the second upper duct 22 that is nearest to the second side 10*b*. At this time, when other design elements are kept constant, a flow speed of a fluid sent into the chamber 10 may be uniformly controlled. This is because a flow speed of a fluid received by the second upper duct 22 may decrease in a movement direction.

Figure 10:
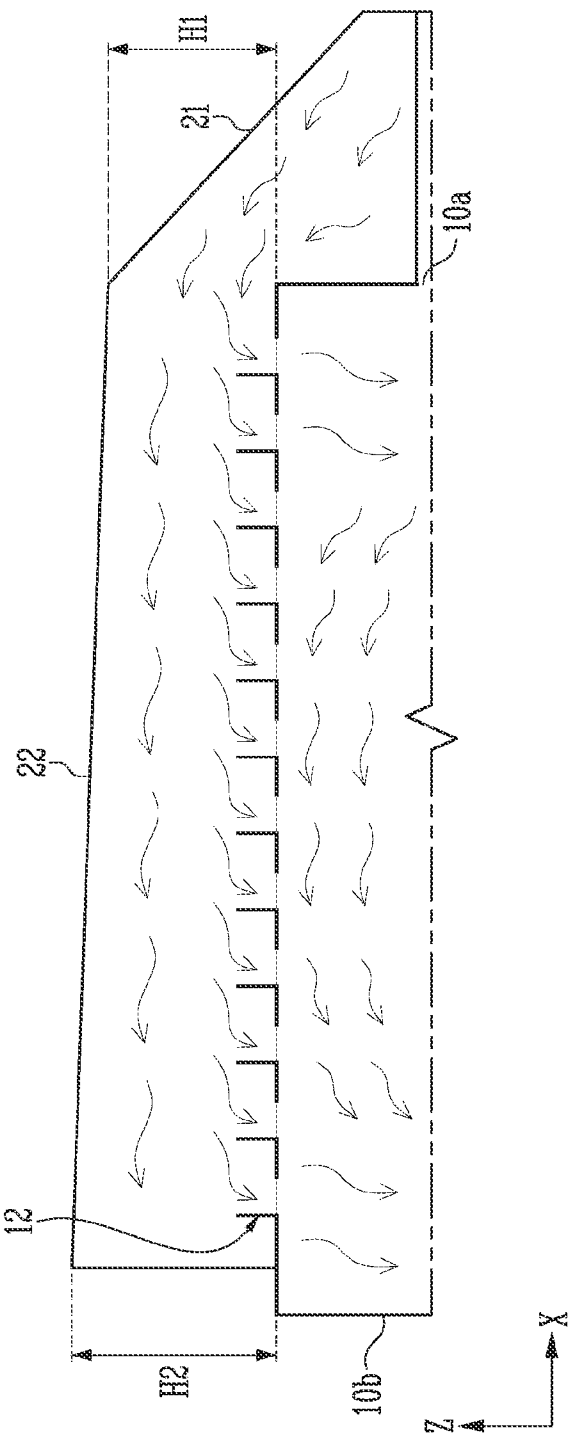

In another embodiment, a height of the second upper duct 22 may increase in a direction from the first side 10*a* toward the second side 10*b* facing the first side 10*a*. FIG. 10 shows a height of the second upper duct 22 increasing in a direction from the first side 10*a* to the second side 10*b*. A flow speed of a fluid sent into the chamber 10 may decrease as a height of the second upper duct 22 increases. A height H1 of the second upper duct 22 that is nearest to the first side 10*a* may be smaller than a height H2 of the second upper duct 22 that is nearest to the second side 10*b*. At this time, a flow speed of a fluid sent into the chamber 10 may be uniformly maintained when other design elements are further controlled.

In one embodiment, a height of the first upper duct 21 may decrease in a direction away from the chamber 10. In a drawing showing a thermo-hygrostat device 100 of the present disclosure, it may be seen that the first upper duct 21 is inclined in a direction away from the chamber 10. Through this, the first upper duct 21 can more smoothly send a fluid received from the fluid transfer portion 50 to the second upper duct 22.

In one embodiment, the sample (S) may be a battery including, e.g., a rechargeable secondary battery such as a lithium ion secondary battery. A temperature of a battery may vary, and specifically, increase due to heat generated during the performance evaluation process. Since a thermo-hygrostat device 100 of the present disclosure can well maintain temperature and humidity inside a chamber 10 at predetermined values, performance of a battery affected by temperature and humidity can be accurately evaluated.

In one embodiment, type, specifications, size, etc. of the battery are not limited. The battery may be a secondary battery. The battery may be a lithium secondary battery. The battery may be a lithium ion battery. In addition, the battery may be a unit cell that is a basic unit thereof (comprising a positive electrode, a negative electrode, and a separator interposed between the positive electrode and the negative electrode). The battery may be a unit battery cell stack in which the plurality of unit battery cells are stacked. The battery may be a battery cell in which the unit battery cell stack is accommodated in a case. The battery may be a battery module accommodating the plurality of battery cells in a case. The battery may be a battery pack in which the plurality of battery modules are accommodated in a case together with a management device (a battery management system, a temperature maintenance system, or the like).

The description above is merely an example of applying the principles of the present disclosure, and other configurations may be further included without departing from the scope of the present disclosure.

The disclosed technology can be used for testing the performance of rechargeable secondary batteries and modules of rechargeable secondary batteries that are widely used in battery-powered devices or systems, including, e.g., digital cameras, mobile phones, notebook computers, hybrid vehicles, electric vehicles, uninterruptible power supplies, battery storage power stations, and others including battery power storage for solar panels, wind power generators and other green tech power generators. Specifically, the disclosed technology can be used to facilitate evaluating operation performance of, and improving designs of, rechargeable batteries used in various power sources and power supplies including battery-based energy storage systems (ESSs) to store renewable energy such as solar power and wind power, thereby facilitating mitigation of climate changes in connection with uses of power sources and power supplies and addressing various adverse effects such as air pollution and greenhouse emissions by powering electric vehicles (EVs) as alternatives to vehicles using fossil fuel-based engines.

Only specific examples of implementations of certain embodiments of the disclosed technology are described. Variations, improvements and enhancements of the disclosed embodiments and other embodiments may be made based on the disclosure of this patent document

What is claimed is:

1. A thermo-hygrostat device comprising:

a chamber in which a sample is accommodated, in which internal temperature and humidity are controlled to predetermined temperature and humidity, and which comprises a plurality of holes provided on a surface thereof;

a first duct provided on a first side of the chamber and sending a fluid inside the chamber to an outside of the chamber;

a temperature and humidity control portion provided on the first duct and controlling temperature and humidity of a fluid received from the first duct;

a fluid transfer portion provided on the temperature and humidity control portion and sending a fluid received from the temperature and humidity control portion;

a second duct comprising a first portion of the second duct provided on the fluid transfer portion and a second portion of the second duct provided on the surface of the chamber and communicating with the first portion of the second duct; and a fluid suction portion provided on the first side of the chamber and configured to send the fluid inside the chamber to the first duct, wherein the first portion of the second duct sends a fluid received from the fluid transfer portion to the second portion of the second duct, and the second portion of the second duct sends a fluid received from the first portion of the second duct into the chamber through the plurality of holes, wherein the fluid transfer portion sends the fluid toward the first portion of the second duct, wherein the second portion of the second duct covers the plurality of holes, wherein the fluid suction portion is configured to suck the fluid inside the chamber, and the first duct is provided to cover the fluid suction portion to receive the fluid discharged from the fluid suction portion and deliver the received fluid to the temperature and humidity control portion provided on the first duct, wherein the first duct, the temperature and humidity control portion provided on the first duct, and the fluid transfer portion provided on the temperature and humidity control portion are sequentially arranged on the first side of the chamber;

wherein the fluid suction portion is disposed between the chamber and the first duct and comprises a plurality of openings configured to send the fluid inside the chamber to the lower duct, wherein each of the plurality of holes has a predetermined length and width and is spaced apart from an adjacent hole in a width direction, and wherein the predetermined length of each of the plurality of holes extends along the first side of the chamber, wherein the second duct is spaced apart from the plurality of holes to define a space therebetween, wherein the first duct is disposed in contact with the first side of the chamber.

2. The thermo-hygrostat device according to claim 1, wherein the fluid transfer portion further comprises:

a blower; and a communication hole communicating the fluid transfer portion and the first portion of the second duct, wherein the blower sends a fluid received from the temperature and humidity control portion toward the first portion of the second duct through the communication hole.

3. The thermo-hygrostat device according to claim 1, wherein the chamber further comprises a protruding portion adjacent to each hole, and the protruding portion is on an opposite side of the first side with reference to each hole.

4. The thermo-hygrostat device according to claim 1, wherein the chamber further comprises a plurality of protruding portions adjacent to each of the plurality of holes, and each of the protruding portions is on an opposite side of the first side with reference to an adjacent hole.

5. The thermo-hygrostat device according to claim 1, wherein a width of each hole decreases in a direction from the first side toward a second side facing the first side.

6. The thermo-hygrostat device according to claim 1, wherein a width of each hole increases in a direction from the first side toward a second side facing the first side.

7. The thermo-hygrostat device according to claim 4, wherein a height of each protruding portion increases in a direction from the first side toward a second side facing the first side.

8. The thermo-hygrostat device according to claim 4, wherein a height of each protruding portion decreases in a direction from the first side toward a second side facing the first side.

9. The thermo-hygrostat device according to claim 1, wherein a height of the first portion of the second duct decreases in a direction away from the chamber.

10. The thermo-hygrostat device according to claim 1, wherein a height of the second portion of the second duct decreases in a direction from the first side toward a second side facing the first side.

11. The thermo-hygrostat device according to claim 1, wherein a height of the second portion of the second duct increases in a direction from the first side toward a second side facing the first side.

12. The thermo-hygrostat device according to claim 1, wherein the sample accommodated in the chamber comprises a battery.

* * * * *